(12) United States Patent
Hirukawa

(10) Patent No.: US 6,661,498 B1
(45) Date of Patent: Dec. 9, 2003

(54) PROJECTION EXPOSURE APPARATUS AND METHOD EMPLOYING RECTILINEAR APERTURE STOPS FOR USE WITH PERIODIC MASK PATTERNS

(75) Inventor: Shigeru Hirukawa, Kashiwa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/546,233

(22) Filed: Apr. 10, 2000

Related U.S. Application Data (63) Continuation of application No. 08/597,982, filed on Feb. 7, 1996, now abandoned.

(30) Foreign Application Priority Data

Feb. 10, 1995 (JP) .............................................. 7-022666

(51) Int. Cl.[7] .......................... G03B 27/42; G03B 27/72
(52) U.S. Cl. .......................................... 355/71; 355/53
(58) Field of Search .............................. 355/30, 52, 53, 355/71, 77

(56) References Cited

U.S. PATENT DOCUMENTS

| | | | | | |
|---|---|---|---|---|---|
| 4,030,825 | A | * | 6/1977 | Ghougasian | .................. 355/71 |
| 4,375,916 | A | * | 3/1983 | Levine | ...................... 355/40 X |
| 4,864,360 | A | * | 9/1989 | Isohata et al. | ................. 355/53 |
| 4,931,830 | A | * | 6/1990 | Suwa et al. | ............... 355/53 X |
| 5,237,367 | A | * | 8/1993 | Kudo | ........................ 355/53 X |
| 5,264,898 | A | * | 11/1993 | Kamon et al. | ............ 355/71 X |
| 5,305,054 | A | * | 4/1994 | Suzuki et al. | .................. 355/53 |
| 5,329,336 | A | * | 7/1994 | Hirano et al. | .................. 355/53 |
| 5,530,518 | A | * | 6/1996 | Ushida et al. | ................. 355/53 |
| 5,591,958 | A | * | 1/1997 | Nishi et al. | ............... 355/71 X |

FOREIGN PATENT DOCUMENTS

| | | |
|---|---|---|
| JP | 4-180612 | 6/1992 |
| JP | 5-234850 | 9/1993 |
| JP | 7-29807 | 1/1995 |

* cited by examiner

*Primary Examiner*—Fred L. Braun
(74) *Attorney, Agent, or Firm*—Miles & Stockbridge P.C.

(57) ABSTRACT

A projection optical system and method projects and forms an image of a pattern arrayed on a first surface (mask), and exhibiting a periodicity in a predetermined direction (X- or Y-direction), on a second surface (wafer). A stop has an aperture showing a line symmetry with respect to a symmetric axis intersecting an optical axis of the projection optical system and extending in a direction (Y- or X-direction) orthogonal to the predetermined direction and having the outline at least a part of which are rectilinear portions. The stop is disposed on a Fourier transform plane of the first surface within the projection optical system or a surface in the vicinity thereof.

30 Claims, 9 Drawing Sheets

PROJECTION EXPOSURE APPARATUS AND METHOD EMPLOYING RECTILINEAR APERTURE STOPS FOR USE WITH PERIODIC MASK PATTERNS

CROSS REFERENCE TO RELATED APPLICATION

This application is a continuation of application Ser. No. 08/597,982 filed Feb. 7, 1996, now abandoned.

BACKGROUND OF THE INVENTION

1. Field of the Invention

The present invention relates generally to a projection exposure and method for use with a photolithography process for manufacturing a semiconductor device, etc. and a projection optical system thereof and, more particularly, to a projection exposure apparatus and method and a projection optical system that are suitable for an application to a case where a periodical pattern such as, e.g., a line-and-space pattern is transferred on a photosensitive substrate.

2. Related Background Art

A projection optical system for a projection exposure apparatus used when forming hyperfine patterns of, e.g., a semiconductor integrated circuit, a liquid crystal display, etc. in a photolithography process is required to exhibit an extremely high image forming characteristic in order to transfer a variety of different patterns on a reticle (or photomask) onto a photosensitive substrate, such as a wafers, with a fidelity.

Generally, important factors for transferring the hyperfine reticle patterns onto the photosensitive substrate through the projection optical system with fidelity are depth of focus and resolution of the projection optical system. The resolution may be improved simply by increasing a numerical aperture of the projection optical system.

Herein, a relationship between the resolution and the numerical aperture will be explained. In this connection, the patterns of the normal integrated circuit are arrayed mainly in two directions orthogonal to each other, particularly, in the lengthwise (short-side direction) or the cross-wise direction (long-side direction) that are parallel respective sides of shot areas on the wafer. However, there may be a layer of the integrated circuit including very few patterns (oblique patterns) arrayed in an oblique direction or in which there is no oblique pattern at all. Herein, an explanation will be given by taking an example wherein periodic patterns arrayed in the lengthwise direction on, e.g., the reticle are irradiated with illumination light beams for exposure.

Some of the illumination light beams falling on the reticle are partly blocked by the periodic patterns thereof, while the illumination light beams penetrating the reticles contain not only the light components (0th-order) directly passing therethrough but also the light components (diffracted light) diffracted and deflected by the periodic patterns. These two kinds of light components pass through the projection optical system and interfere with each other on the photosensitive substrate to form bright-and-dark fringes, thereby transferring the periodic patterns. Herein, a diffracting angle θ of the diffracted light generated from the reticle is a function of a wavelength λ of the illumination light and a pitch P of the periodic patterns, and, with respect to (n)th-order (n is an integer) diffracted light, the following formula (1) is established:

$$\sin \theta = n\lambda/P \quad (1)$$

That is, the diffracting angle θ becomes larger as the patterns are hyperfiner. Hence, there has been developed the projection optical system (projection lens system and projection mirror system) having a larger numerical aperture to transfer the much hyperfiner patterns with a high accuracy by increasing the resolution. Then, a stop (aperture stop) for defining the numerical aperture is disposed on a pupil plane (Fourier transform plane with respect to the reticle pattern surface) of the projection optical system. The aperture of the conventional aperture stop is of a circular shape, and especially none of those aperture stops has a directivity.

When the circular aperture stop is provided on the pupil plane of the projection optical system however, a maximum diffracting angle at which the light passes through the projection optical system differs in accordance with an incident angle in a direction perpendicular to an arraying direction of the periodic patterns.

Figure 12:
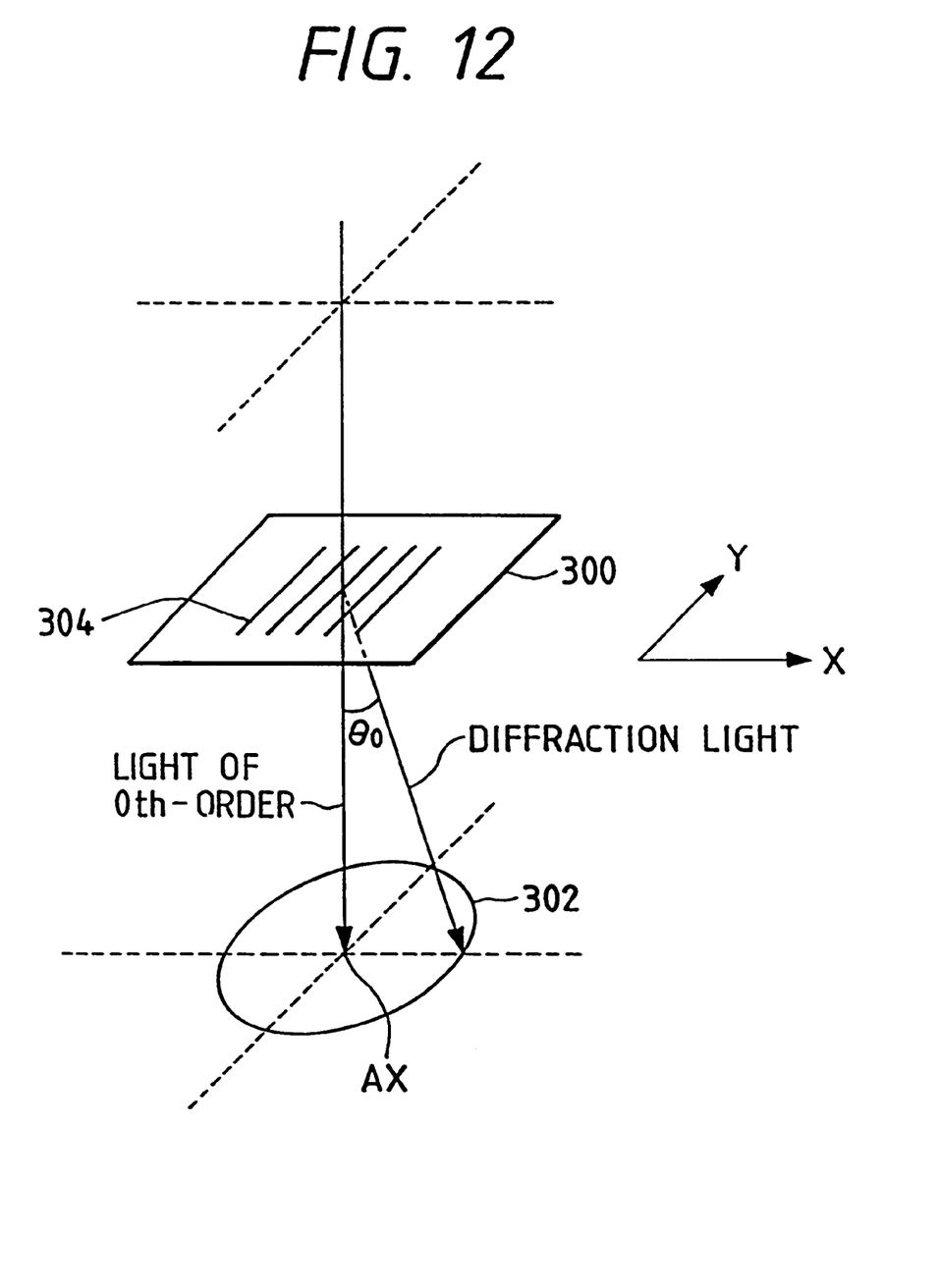
FIG. 12 is a view showing a relationship between diffracted light from vertical illumination light and a circular aperture stop of the projection optical system.
Figure 13:
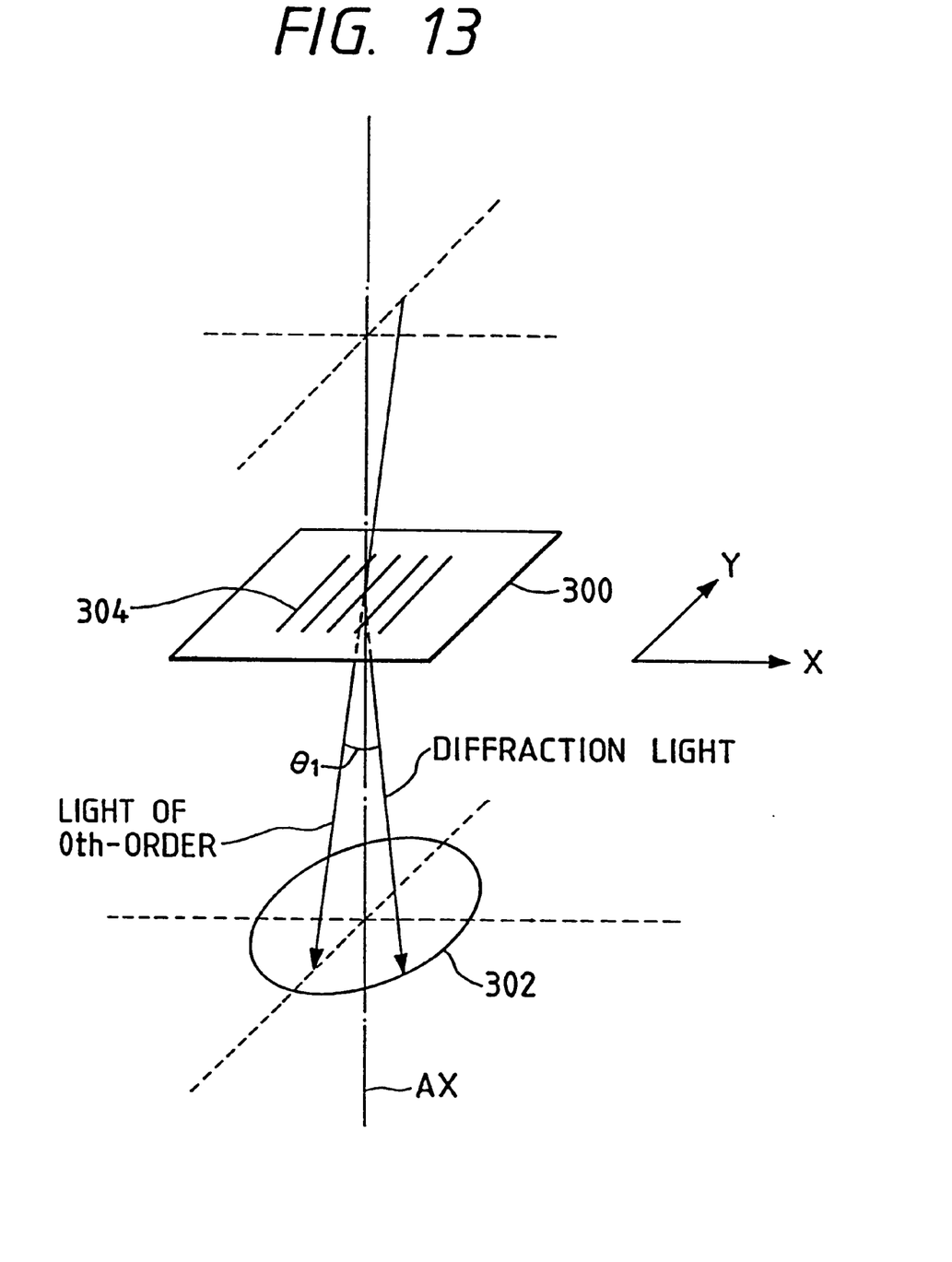
FIG. 13 is a view showing a relationship between the diffracted light from inclined illumination light and the circular aperture stop of the projection optical system.

FIGS. 12 and 13 show a relationship between the incident angle of the illumination light upon a reticle 300 and a circular aperture stop 302 of the projection optical system.

As illustrated in FIG. 12, when the illumination light (vertical illumination light) is incident, parallel to an optical axis, on periodic patterns 304 arrayed in the X-direction on the reticle 300, the diffracted light of an exit angle $\theta_0$ corresponding to a numerical aperture (termed NA) of the projection optical system is capable of passing through the projection optical system. That is, in the case of the vertical illumination light, a sine of the effective exit angle $\theta_0$ of the diffracted light is substantially equal to NA.

However, when the illumination light is incident on the reticle 300 with an inclination in the Y-direction to the optical axis AX, as illustrated in FIG. 13, a quantity of the diffracted light capable of passing through the projection optical system is smaller than the vertical illumination light. Namely, when the illumination light is incident with an inclination in the Y-direction, the sine of an effective exit angle $\theta_1$ of the diffracted light is smaller than NA.

For instance, if the sine of the incident angle of the illumination light in the Y-direction perpendicular to the arraying direction of the patterns is 0.7 times the numerical aperture on the incident side (NA of the illumination optical system), it follows that the sine of the effective exit angle of the diffracted light becomes 0.7 times (=0.7 NA) the sine of the effective exit angle of the diffracted light in the case of the vertical illumination light.

Further, in the case of a the larger numerical aperture, a range of the incident angle on the wafer is also increased, and hence a phase difference between the light beams for forming the image due to a difference between the incident angles is increased. This decreases an effect in which the light beams interfere and thus enhance each other, even in, e.g., a bright-image position, and there is a larger degree of decrease in resultant image contrasts. It has been gradually recognized in recent years that an excessive numerical aperture is not desirable, in order to obtain a sufficient depth of focus.

As explained above, in the projection optical system including the circular aperture stop, the effective exit angle differs depending on the incident angle of the illumination light incident on the projection optical system. If the sine of the incident angle optimizes the numerical aperture of the projection optical system with respect to the illumination light, that is, approximately, e.g., 0.7 times the numerical aperture, on the incidence side, the numerical aperture is excessive for the vertical illumination light. For this reason, even when in the case of an expensive projection optical system having a large numerical aperture, and when having such a circular aperture stop that the exit angle of the light capable of passing through the projection optical system differs depending on the incident angle, there is a disadvantage in that the performance thereof is insufficient.

Further, though the great majority of patterns of the actual integrated circuit are formed of the patterns in the lengthwise and crosswise-directions, hyperfine patterns may also exist in oblique directions. In such a case, it is also desirable that the numerical aperture be not varied depending on the incident angle in an oblique direction. Hence, there is needed a projection optical system capable of high performance even with patterns in oblique directions as the necessity arises.

SUMMARY OF THE INVENTION

It is a primary object of the present invention, which was devised in view of the above points, to provide a projection optical system having a proper numerical aperture on the whole with less difference between effective exit angles dependent on incident angles in a direction perpendicular to a predetermined direction of illumination light and a projection exposure apparatus and method employing this projection optical system.

A projection optical system according to the present invention projects and forms an image of a pattern (20) arrayed on a first surface (14) and exhibiting a periodicity in a predetermined direction (X- or Y-direction) onto a second surface (17). A stop (16; 16A) includes an aperture (106) showing a line symmetry with respect to a symmetric axis (Y1, X1) intersecting an optical axis (AX) of the projection optical system and extending in a direction (Y- or X-direction) orthogonal to the predetermined direction and having an outline (109) at least a part of which are rectilinear portions. This stop is disposed on a Fourier transform plane of the first surface (14) within the projection optical system or a plane in the vicinity thereof.

In this case, the outline (109) of the stop (16; 16A) preferably has rectilinear portions parallel to the symmetric axis (Y1, X1).

Further, the stop (16; 16A) preferably includes a plurality of movable blades (101A, 101B) having rectilinear edges each for defining the outline (109) of the aperture (106).

Moreover, a projection exposure apparatus according to the present invention is equipped with a projection optical system. A mask (14) formed with a pattern (20) to be transferred is disposed on a first surface thereof, while a photosensitive substrate (17) is disposed on a second surface thereof. The projection exposure apparatus comprises an illumination optical system (1–6, 8a, 8c, 8d, 9–13) for Köhler-illuminating the mask with beams of exposure illumination light that are emitted from such a surface light source that its outline corresponding to the rectilinear portions of the outline (109) of the aperture (106) of the stop (16) takes a rectilinear shape.

In this case, the surface light source of the illumination optical system takes a rectangular frame-like configuration (8d) as one example thereof.

According to the projection optical system of the present invention described above, when projecting the pattern (20V) arrayed at a predetermined pitch in, e.g., the X-direction, the stop (FIG. 5B) showing line symmetry with respect to the symmetric axis (Y1) parallel to the Y-direction (perpendicular to the X-direction) and having the rectilinear portions is disposed in the vicinity of the Fourier transform plane surface of the projection optical system (15). With this arrangement, the projection optical system transmits substantially the same quantity of diffracted light from the pattern (20V) due to the illumination light inclined in the Y-direction as the diffracted light due to the vertical incidence light. That is, there is only a small difference between the effective exit angles. Note that if the aperture of the aperture stop does not have a circular shape, the direction of the diffracted light generated from the pattern differs depending on a direction of the pattern to be transferred. Therefore, it follows that the numerical aperture changes based on the pattern direction. Herein, if the numerical aperture differs, the range of the incident angle on the image surface of the diffracted light for forming the image differs if the numerical aperture is different, and, therefore, image forming characteristic such as image contrast and depth of focus become different. For this reason, when adjusting the image forming characteristic of the projection optical system, an undesirable aperture stop is one having an aperture of a square shape or the such that image forming performance differs depending on the pattern direction. A desirable aperture stop is therefore one having a circular aperture when adjusting the projection optical system and one having a square aperture or the like when an actual exposure is conducted.

Further, if the outline (109; 103a) of the aperture of the stop (16; 16A) includes rectilinear portions parallel to the symmetric axis thereof, even when the incident angle differ, the diffracted light generated from the pattern arrayed in the predetermined direction on the mask substantially uniformly travels through the projection optical system. Hence, there is almost no difference between the effective exit angles, and the numerical aperture is optimized.

Also, when the stop (16; 16A) includes the plurality of movable blades (101A, 101B) having the rectilinear edges each for defining the outline (109) of the aperture (106), the shape of the aperture can be varied corresponding to, e.g., the actual exposure and the adjustment of the projection optical system.

Further, in the projection exposure apparatus incorporating the projection optical system (15) according to the present invention, the range of the effective diffracting angle does not change even if the incident angle of the illumination light incident on the projection optical system (15) changes, and the numerical aperture of the projection optical system (15) is optimized, thereby obtaining a good image forming characteristic. Moreover, in the case of the Köhler illumination, the surface light source of the illumination optical system is formed on the pupil plane of the projection optical system, and hence at least a part of the outline of the surface light source also is formed in the rectilinear shape in accordance with the configuration of the stop in the vicinity of the pupil plane thereof, whereby image forming characteristics are enhanced, and there is a reduced amount of harmful image forming light beams.

Also, if the surface light source of the illumination optical system assumes a rectangular frame-like shape (8d), there is conducted illumination in which a normal annular illumination method is optimized for the patterns in the lengthwise-direction and crosswise-direction.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

The present invention will hereinafter be discussed by way of one embodiment of a projection optical system and a projection exposure apparatus with reference to FIGS. 1 through 5B. In this embodiment, the present invention is applied to a stepper type projection exposure apparatus for reducing and projecting a reticle pattern on each shot area on a wafer through the projection optical system.

Figure 1:
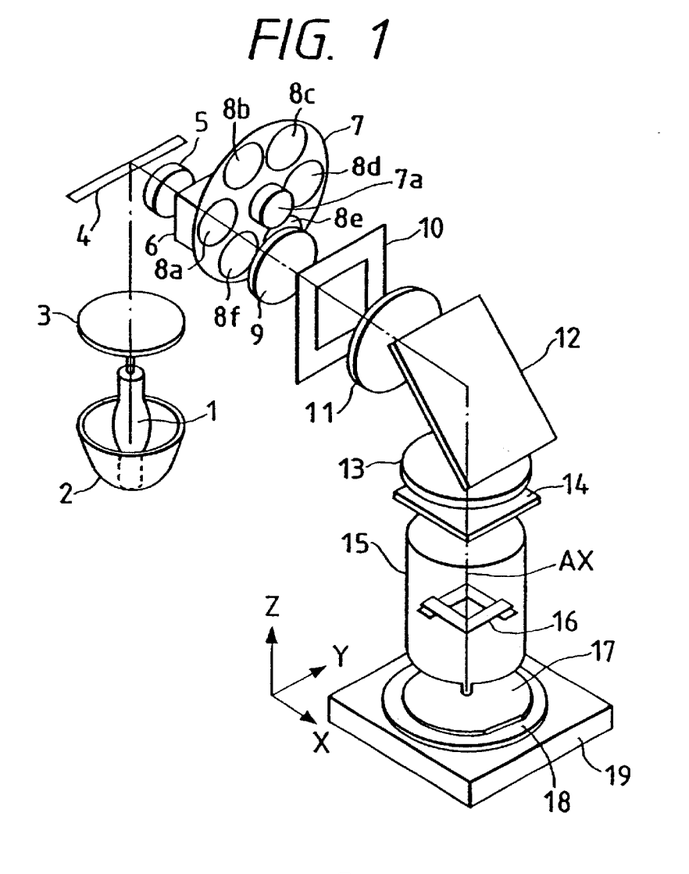
FIG. 1 is a perspective view schematically illustrating a construction of one embodiment of a projection exposure apparatus according to the present invention.

FIG. 1 is a perspective view schematically illustrating a construction of the projection exposure apparatus in this embodiment. Referring to FIG. 1, beams of illumination light emitted from a light source 1 for an exposure are converged by an elliptical mirror 2 point thereof and thereafter become beams of divergent light. The divergent light travels through an unillustrated shutter for controlling passage and interception of the illumination light, and a short-wave cut filter as well, and is then incident on an interference filter 3, wherein only a desired spectrum needed for the exposure, i.e., only the i-line in the case of a mercury lamp, is extracted. The illumination light emerging from the interference filter 3 is deflected substantially at a right-angle by a deflecting mirror 4 and turns out becomes parallel beams through an input lens 5. Then, the parallel beams fall on a fly-eye lens 6 serving as an optical integrator.

Note that the illumination light for the exposure is not limited to the i-line, but the g-line or the like may also be used. Further, the exposure light source 1 may involve the use of an excimer laser light source and a higher harmonic wave generating device of metallic vapor laser beams or YAG laser beams in addition to the mercury lamp.

Then, in exit surfaces of individual lens elements of the fly-eye lens 6, secondary light sources (light source images) are formed. Accordingly, the exit surface of the fly-eye lens 6 is formed with a multiplicity of light source images the number of which is the same as the number of lens elements, thereby forming a surface light source. A variety of switchable aperture stops 8a–8f for adjusting a configuration and a size of the surface light source are disposed on the exit surface of the fly-eye lens 6. Those aperture stops 8a–8f are fixed to a turret-like disk 7 and so disposed as to be switched over by a drive device for a rotational drive. FIG. 1 illustrates a state where the aperture stop 8a is disposed on an illumination light path.

Figure 2:
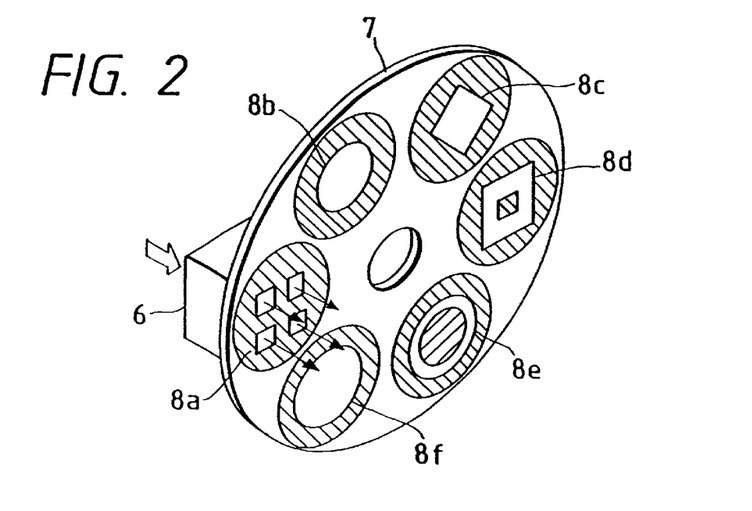
FIG. 2 is a perspective view showing six apertures of an aperture stop of an illumination optical system of FIG. 1.

FIG. 2 is a perspective view illustrating specific constructions of the aperture stops 8a–8f of FIG. 1. Referring to FIG. 2, the aperture stops 8a–8f are fixed at intervals of substantially equal angles along the periphery of the turret-like disk 7. These six aperture stops 8a–8f are provided each for intercepting part of the illumination light. The first aperture stop 8a is a stop for a so-called modified light source method and is constructed so that the beams of illumination light in the vicinity of an optical axis are blocked, and the illumination light beams pass through four rectangular apertures formed at equal distances from the optical axis. The second aperture stop 8b is formed with a relatively small circular aperture at its central portion. The third and fourth aperture stops 8c, 8d are stops in which outlines of the respective surface light sources are defined by rectilinear lines. Further, the fifth aperture stop 8e is classified as an annular stop, and the sixth aperture stop 8f is a normal circular stop.

Referring back to FIG. 1, the illumination light beams traveling through the aperture stop 8a penetrate a first relay lens 9, a reticle blind 10 and a second relay lens 11 and are deflected substantially at a right angle by a deflecting mirror 12. Thereafter, a reticle 14 is illuminated with the illumination light beams with a uniform illumination distribution via a condenser lens 13. In this case, the exit surface (formed with the surface light sources) of the fly-eye lens 6 is formed as a Fourier transform surface with respect to a pattern surface of the reticle 14. That is, the reticle 14 is Köhler-illuminated with the light beams through the above-constructed illumination optical system. Accordingly, a pupil plane (i.e., Fourier transform surface with respect to the pattern surface of the reticle 14) of a projection optical system 15 is formed with an image of the aperture stop 8a.

Further, the reticle blind 10 assumes an image-forming (or conjugate) relationship with the reticle 14. An illumination area on the reticle 14 can be restricted by an aperture shape of the reticle blind 10. Herein, referring to FIG. 1, a Z-axis is parallel to an optical axis AX of the projection optical system 15, while X- and Y-axes are orthogonal to each other within plane perpendicular to the optical axis AX.

Figure 3:
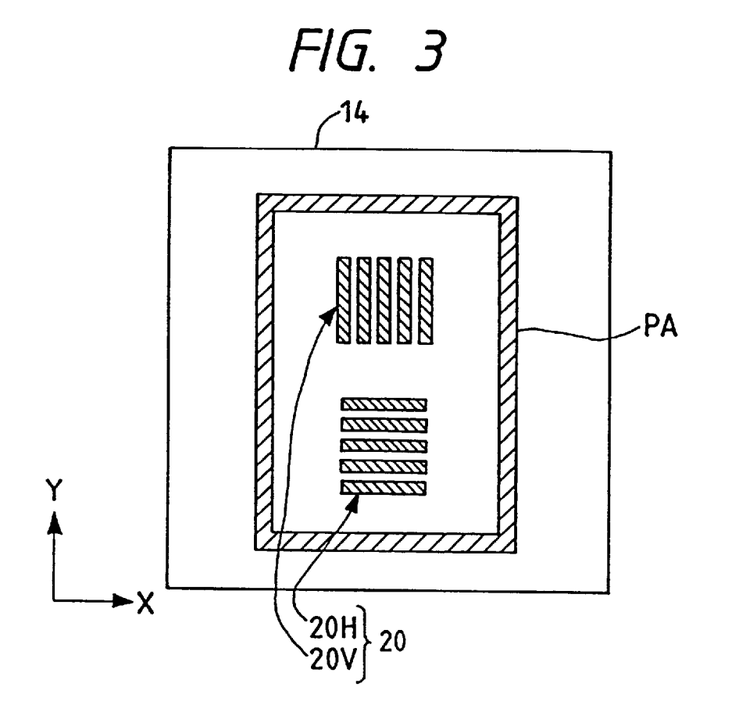
FIG. 3 is a plan view showing one example of a pattern of a reticle of FIG. 1.

FIG. 3 is a plan view schematically illustrating a configuration of the reticle 14. Referring to FIG. 3, the reticle 14 has an effective area (pattern area) PA substantially at the central portion thereof, and this effective area PA is formed in a rectangular shape elongating in a Y-direction corresponding to a shape of a semiconductor integrated circuit. Herein, a reticle pattern 20 includes a lengthwise pattern 20V representative of a lengthwise (short-side direction) pattern, consisting of five light shielding strips extending in the Y-direction and arranged at equal spacings in the X-direction. The reticle pattern 20 also includes a crosswise pattern 20H representative of a crosswise (long-side direction) pattern, consisting of five light shielding strips extending in the X-direction and arranged at equal spacings in the Y-direction.

The reticle 14 on which the reticle pattern 20 is depicted is vacuum-adsorbed onto an unillustrated reticle stage.

Referring back to FIG. 1, the illumination light beams penetrating the pattern surface fall on the projection optical system 15. The projection optical system 15 in this embodiment is double-side-telecentric but may be one-side-telecentric. An aperture stop 16 with a variable aperture shape is disposed on the pupil plane in the projection optical system. This aperture stop 16 will hereinafter be mentioned in greater detail.

The illumination light beams emitted from the projection optical system fall on a wafer 17 coated with a photoresist, and a reduced image of the reticle pattern 20 on the reticle 14 is projected on the wafer 17.

The wafer 17 is vacuum-adsorbed and thus held on a wafer holder 18 mounted on a wafer stage 19. The wafer stage 19 is moved in the X- and Y-directions by an unillustrated moving system, thus positioning the wafer 17. The wafer 17 can be also micro-moved in a rotating direction on an X-Y plane as well as in the Z-direction parallel to the optical axis AX. The movement of the wafer stage 19 is controlled by an unillustrated control system.

Next, a construction of the aperture stop 16 will be explained in detail with reference to FIGS. 4 to 5B.

Figure 4:
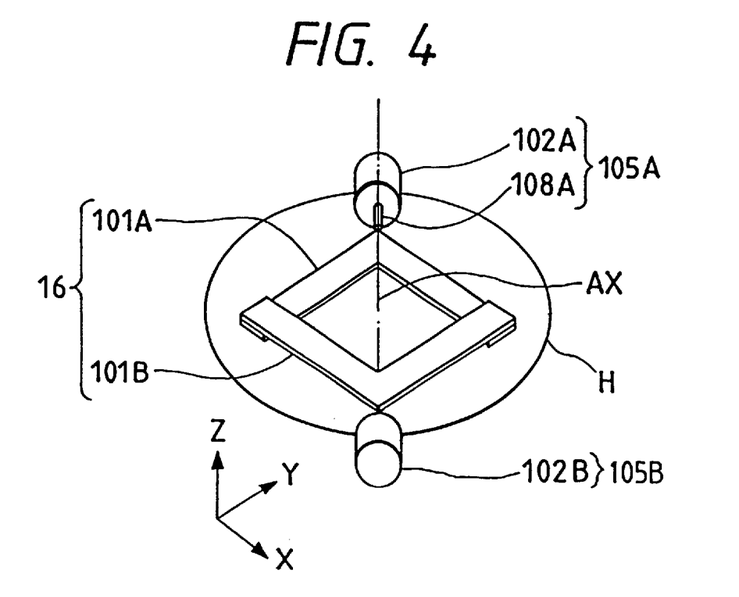
FIG. 4 is a perspective view illustrating an aperture stop 16 used in a projection optical system of FIG. 1.

FIG. 4 is an enlarged perspective view illustrating the aperture stop 16 of FIG. 1. As shown in FIG. 4, a couple of L-shaped plate-like movable blades 101A, 101B constituting the aperture stop 16 are disposed in positions symmetric with respect to the optical axis AX on a pupil plane H of the projection optical system 15. The movable blade 101A is moved by a moving mechanism 105A constructed of a drive motor 102A and feed screw 108A. An unillustrated nut screwed to the feed screw 108A is fixed in a direction along the optical axis AX onto the surface of an L-shaped angular portion of the movable blade 101A on the side of the wafer 17. The angular portion of the movable blade 101A is moved along a straight line (along the pupil plane H of the projection optical system 15) intersecting the optical axis AX with rotations of the drive motor 102A. Similarly, the movable blade 101B is moved by a moving mechanism 105B constructed of a drive motor 102B and an unillustrated feed screw along the straight line (along the pupil plane H of the projection optical system) intersecting the optical axis AX.

Figure 5A:
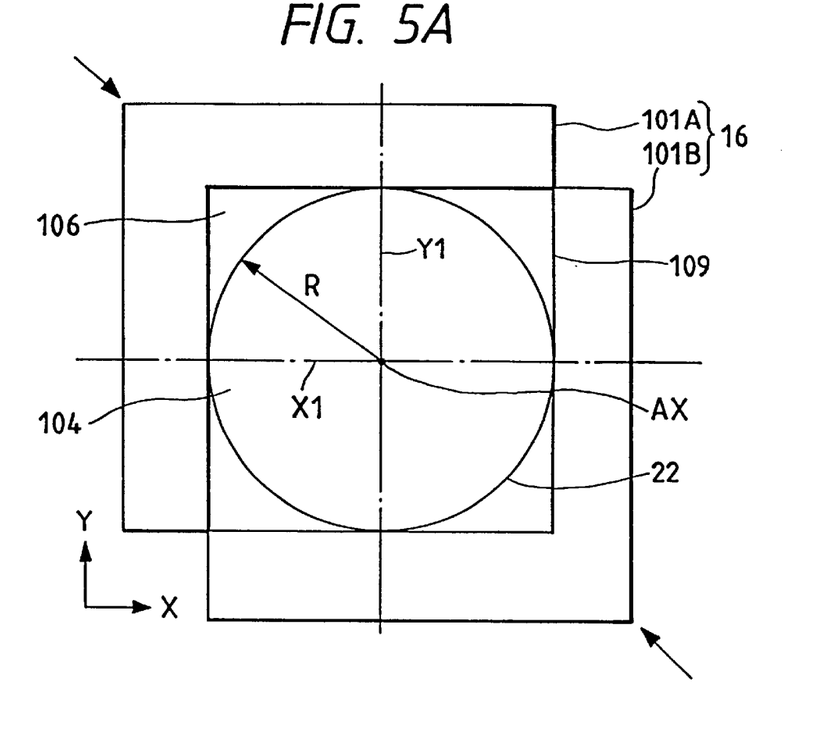
FIGS. 5A and 5B are enlarged plan views showing an operation of the aperture stop 16 of FIG. 4.
Figure 5B:
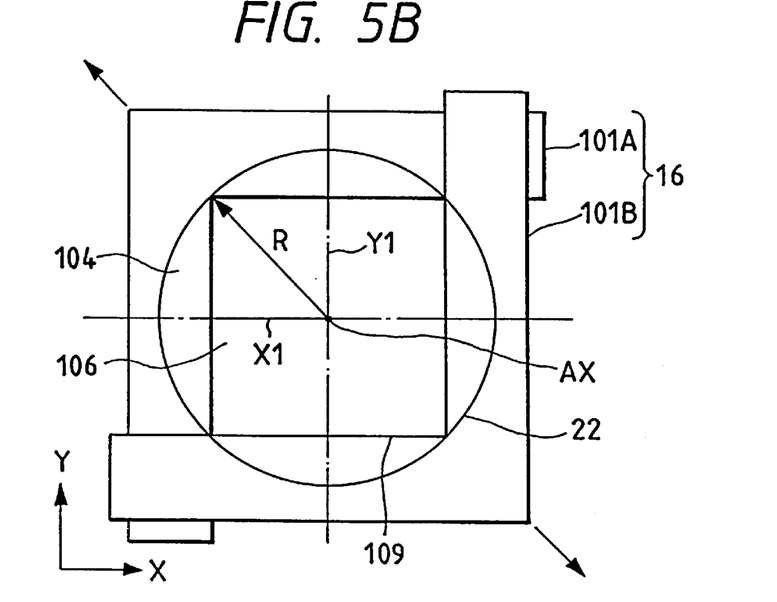

FIGS. 5A and 5B are enlarged plan views of the variable aperture stop 16. FIG. 5A illustrates a state where the aperture size is largest. FIG. 5B illustrates a state where the aperture size is smallest. Referring to FIG. 5A, the couple of movable blades 101A, 101B of the aperture stop 16 are set in such positions that the aperture is maximized. An aperture stop 22 with a fixed radius R for determining a numerical aperture of the projection optical system 15 is inscribed to internal edges of the couple of movable blades 101A, 101B. Internal edges 109 of the L-shaped movable blades 101A, 101B, which bear a face-to-face relationship with each other, are formed as rectilinear edges parallel to the X- and Y-axes, respectively.

The L-shaped movable blades 101A, 101B are so disposed on the X-Y plane perpendicular to the optical axis AX as to be symmetric with respect to the optical axis AX. Two rectilinear portions (hereinafter referred to as internal edge rectilinear portions) forming substantially right-angled internal corners of the movable blades 101A, 101B are disposed respectively in parallel to the X- and Y-axes. Accordingly, the internal edge rectilinear portions, each parallel to the X-axis, of the movable blades 101A, 101B are so disposed as to be symmetric with respect to an X-directional symmetric axis X1 intersecting the optical axis but parallel to the X-axis. Similarly, the internal edge rectilinear portions, each parallel to the Y-axis, of the movable blades 101A, 101B are so disposed as to be symmetric with respect to a Y-directional symmetric axis Y1 intersecting the optical axis AX but parallel to the Y-axis.

The movable blades 101A, 101B positioned as shown in FIG. 5A are moved in arrowed directions by moving mechanisms 105A, 105B of FIG. 4. FIG. 5B shows a state where the aperture of the movable blades 101A, 101B is contracted most, wherein a square aperture 106 is so formed as to be inscribed to the aperture stop 22 having the radius R.

The aperture defined by the movable blades 101A, 101B constituting the aperture stop 16 in this embodiment can be opened to the desired extent by selecting a plurality of positions from a full-open position shown in FIG. 5A to a least-open position shown in FIG. 5B. The full-open position of FIG. 5A is used when making an adjustment of, e.g., the projection optical system 15. The operation of the movable blades 101A, 101B can be controlled by an unillustrated central control system. A relationship between exposure conditions and set positions of the movable blades 101A, 101B is stored beforehand in the central control system in the form of an exposure condition set file. When the exposure condition is set, the movable blades 101A, 101B are moved to predetermined positions by driving of the moving mechanisms 105A, 105B on the basis of a command given from the central control system.

The aperture of the aperture stop 16 having the configuration described above is set in the full-open position with respect to a layer that is better with a larger numerical aperture as in the case of, e.g., a hole layer but in the least-open position with respect to a layer composed of comparatively rough lines. Further, the aperture is set in an intermediate position therebetween with respect to a comparatively fine line pattern. Note that the positions of the movable blades 101A, 101B are, though not illustrated, obtained by a digital micrometer or detected by a rotary encoder attached to a motor shaft for driving, and differences from set values can be corrected.

Next, the operation of the projection exposure apparatus in this embodiment will be explained.

A first characteristic of the projection exposure apparatus in this embodiment is that an aperture stop 16 different from the conventional aperture stop is provided on the pupil plane H of the projection optical system 15 of FIG. 1. A size of the aperture is variable by the L-shaped movable blades 101A, 101B of FIGS. 5A and 5B that constitute this aperture stop 16. A passage area of the diffracted light traveling through the pupil is restricted by the edges showing linear symmetry with respect to the X-directional symmetric axis X1 and the edges showing linear symmetry with respect to the Y-directional symmetric axis Y1. An effective exit angle of the diffracted light emitted from the projection optical system 15 can be thereby uniformized. To start with, there will be described a case where the circular aperture stop 8b is disposed on an exit surface of the fly-eye lens 6.

The crosswise pattern 20H and the lengthwise pattern 20V of the reticle pattern 20 on the reticle 14 of FIG. 3 are illuminated with the illumination light beams emerging from the illumination optical system, thereby generating diffracted light. Hereinbelow, the explanation is focused on only the crosswise pattern 20H because of being the same with the lengthwise pattern 20V. In this case, the movable blades 101A, 101B are set in the state of FIG. 5B.

As the order becomes higher, the Y-directionally periodic diffracted light from the crosswise-direction pattern 20H is incident on the projection optical system 15 at a larger diffraction angle given by the above formula (1). Generally, the lens unit of the projection optical system exhibits a circular spread, and, particularly, the higher-order diffracted light is incident on the aperture stop formed on the pupil plane while having the circular spread.

The L-shaped movable blades 101A, 101B constituting the aperture stop 16, however, have the edges parallel to the X-axis and symmetric with respect to the X-directional symmetric axis X1. Hence, the wide-angle diffracted light from the crosswise pattern 20H, incident on the projection optical system 15, is hindered uniformly from traveling through the aperture by the edges parallel to the X-axis thereof. These edges are formed in parallel to the X-direction, and therefore, even if the illumination light beams are inclined in the X-direction, an effective maximum diffraction angle of the diffracted light generated from the crosswise pattern 20H and passing through the projection optical system 15 is equal to the effective maximum diffraction angle in the case that the illumination light beams are incident perpendicularly (i.e., not inclined). Accordingly, the image of the crosswise pattern 20H is projected with a high resolution on the wafer 17, and a depth of focus of the projected image is enhanced.

As discussed above, according to this embodiment, the shape and size of the aperture of the aperture stop 16 provided in the projection optical system 15 are varied corresponding to the exposure conditions, and hence image forming characteristics based on the optimum numerical aperture are obtained with respect to a variety of patterns, with the result that the exposure can be performed under the optimum conditions.

Next, another embodiment of the present invention will be explained with reference to FIGS. 6 to 8B. In this embodiment, there is provided an aperture stop 16A constructed such that a substantially circular iris stop 103 is assembled in the same movable blades 101A, 101B as those in the embodiment of FIG. 1. Other configurations thereof are the same as those in the embodiment of FIG. 1. This aperture stop 16A is also disposed on the pupil plane of the projection optical system 15 as in the embodiment of FIG. 1.

Figure 6:
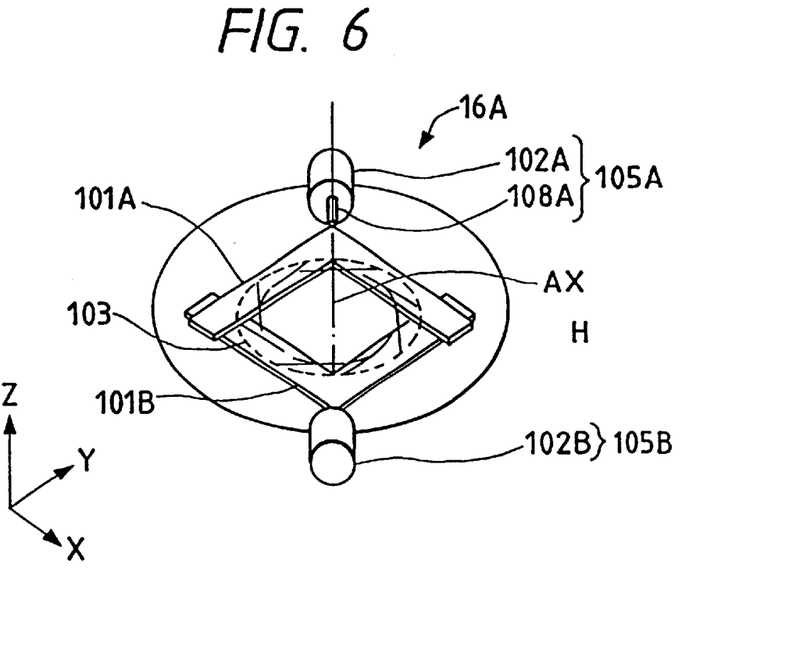
FIG. 6 is a perspective view illustrating another example of the aperture stop used in the projection optical system of the present invention.

FIG. 6 illustrates a construction of the aperture stop 16A in this embodiment. Referring to FIG. 6, the aperture stop 16A disposed on the pupil plane H of the projection optical system 15 is constructed of the movable blades 101A, 101B and the iris stop 103. The iris stop 103 is an aperture stop having a substantially circular aperture the size of which is variable by an unillustrated moving mechanism. The iris stop 103 is disposed so that this stop 103 is smoothly contiguous onto the movable blades 101A, 101B movable similarly by the moving mechanisms 105A, 105B or in close proximity thereto and is coaxial with the optical axis AX of the projection optical system 15.

Figure 7:
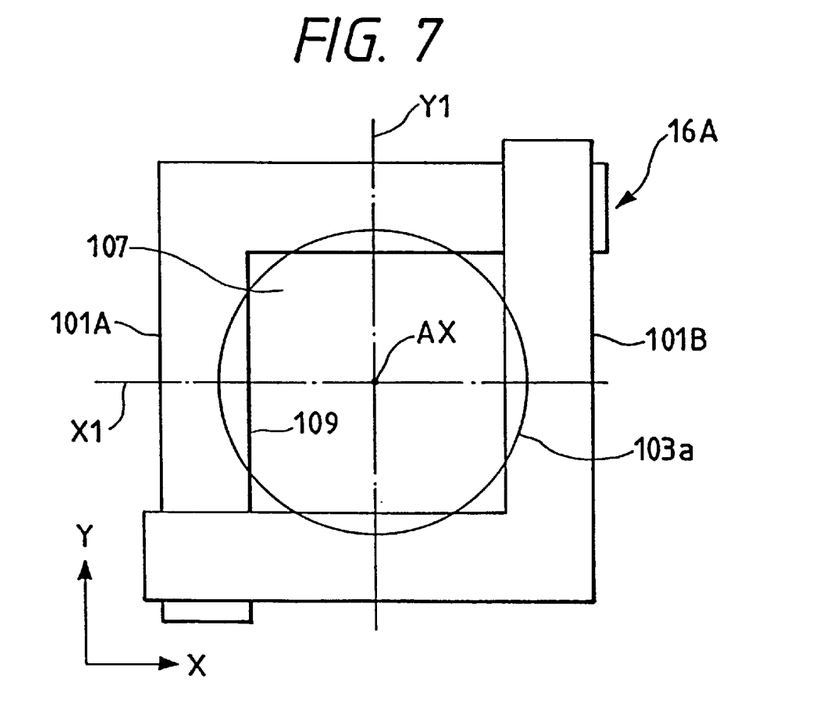
FIG. 7 is an enlarged plan view showing an aperture stop 16A of FIG. 6.

FIG. 7 is an enlarged plan view showing the aperture stop 16A of FIG. 6. Referring to FIG. 7, the movable blades 101A, 101B are set in such positions that the aperture is minimized. As in the embodiment of FIG. 5, the L-shaped movable blades 101A, 101B have internal rectilinear edges bearing the face-to-face relationship with each other and disposed in parallel to X- and Y-axes, respectively. Further, an outline of the aperture of the iris stop 103 is defined by an internal circular edge 103a.

The moving mechanisms respectively for the iris stop 103 and the movable blades 101A, 101B constituting the aperture stop 16A in this embodiment are controlled by an unillustrated central control system. A relationship between the exposure conditions, the set positions of the movable blades 101A, 101B and an aperture size of the iris stop 103 is stored beforehand in the central control system. When the exposure condition is set, the movable blades 101A, 101B are moved to predetermined positions by driving of the moving mechanisms 105A, 105B on the basis of a command given from the central control system, and the aperture size is adjusted.

Next, the operation of the projection optical system in this embodiment will be explained.

In accordance with this embodiment, the numerical aperture of the projection optical system 15 is changed by the aperture of the iris stop 103, and, with this change, a passage angle of the diffracted light in the lengthwise and crosswise directions through the projection optical system 15 can be controlled by shifting the positions of the movable blades 101A, 101B. Further, according to this embodiment, it is also possible to restrict a range of the diffraction angle from the patterns arrayed not only in the lengthwise/crosswise directions (X- and Y-directions) shown in FIG. 5B in the preceding embodiment but also in an oblique direction (intersecting the two X- and Y-axes at, e.g., 45°). For this purpose, as depicted in FIG. 7, a diameter of the internal edge 103a of the iris stop 103 may be set shorter than a length of a diagonal line of the square aperture defined by the movable blades 101A, 101B. At this time, the aperture of the aperture stop 16A becomes an aperture 107 in such a shape that the four corners of the square defined by the internal edges of the movable blades 101A, 101B are shielded by the iris stop 103. With this arrangement, the range of the diffraction angle of the diffracted light from the pattern in the oblique direction is restricted, and the numerical aperture of the projection optical system 15 is uniformized irrespective of an angle of incidence.

Herein, a relationship between a configuration (i.e., aperture stop) of the surface light source of the illumination optical system and a configuration of the aperture of the aperture stop 16A will be explained with reference to FIGS. 8A and 8B.

Figure 8A:
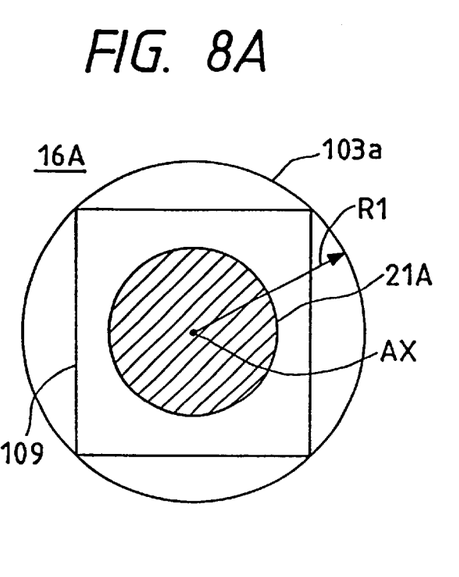
FIGS. 8A and 8B are plan views showing a relationship between a configuration of the aperture stop of the illumination optical system and the aperture stop of the projection optical system when using the aperture stop 16A of FIG. 6.
Figure 8B:
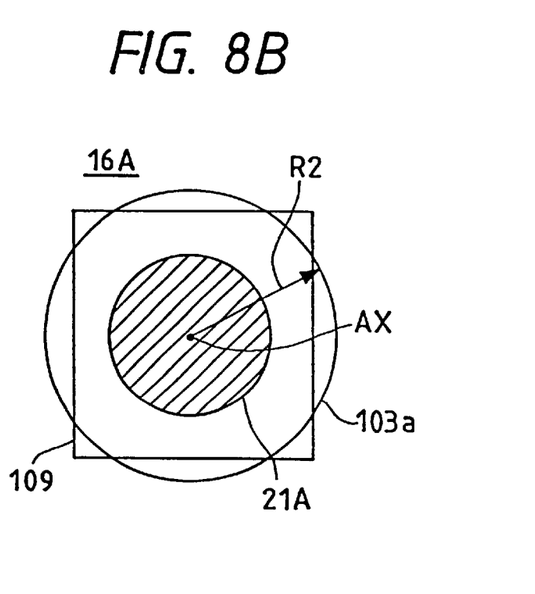

FIGS. 8A and 8B are plan views of assistance in explaining a relationship between a shape of the image of the aperture stop of the illumination optical system and the aperture stop 16A. FIG. 8A illustrates a case where the length of the diagonal line of the internal edges 109 taking the substantially square shape defined by the movable blades 101A, 101B of the aperture stop 16A and the diameter of the internal edge 103a of the iris stop 103 are set to a substantially equal dimension. In this case, a radius R1 of the internal edge 103a of the iris stop 103 is ½ the diagonal line of the square defined by the movable blades 101A, 101B. Further, FIG. 8B shows a case where the diameter of the internal edge 103a of the iris stop 103 is set shorter than the length of the diagonal line of the internal edges 109 taking the substantially square shape defined by the movable blades 101A, 101B of the aperture stop 16A. In this case, a radius R2 of the internal edge of the iris stop 103 is shorter than a ½ length of the diagonal line of the square defined by the movable blades 101A, 101B.

FIGS. 8A and 8B illustrate an example where the aperture stop 8b of FIG. 2 is disposed on the light path by way of the aperture stop of the illumination optical system. Referring to FIGS. 8A and 8B, a circular light source image 21A drawn by oblique lines is projected on the pupil plane H. When transferring a pattern consisting of only vertical/horizontal lines (extending in only the Y- and X-directions) on the reticle 14, diffracted light is generated only in the lengthwise or crosswise direction (Y- or X-direction), and, therefore, the range stopped down by the movable blades 101A, 101B may be a range of the light source image 21A depicted by the oblique lines. Further, no influence is exerted on the image forming in the oblique direction, and hence the same image forming performance is obtained depending on the aperture shapes of the aperture stop 16A of FIG. 8A and of the aperture stop 16A of FIG. 8B.

Herein, there will be explained three modified embodiments in which the aperture stop of the illumination optical system is different from the aperture stop of the illumination system that is obtained by the projection exposure apparatus in this embodiment with reference to FIGS. 9A–9F.

Figure 9A:
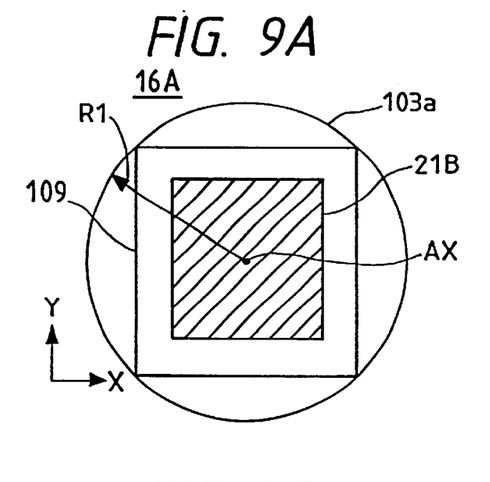
FIGS. 9A to 9F are plan views showing a relationship between a configuration of the aperture stop of the illumination optical system and the aperture stop of the projection optical system when changing the configuration of the aperture stop of the illumination optical system in FIGS. 8A and 8B.
Figure 9B:
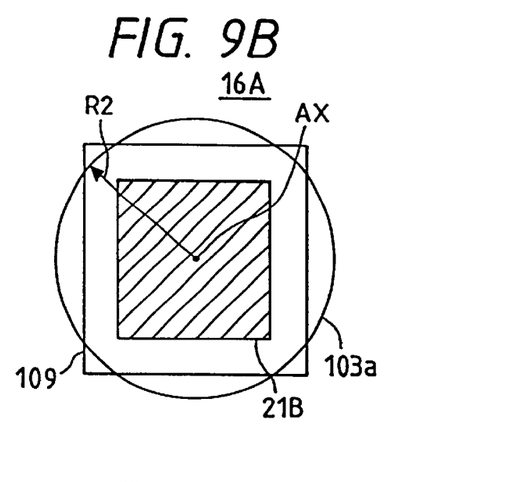
Figure 9C:
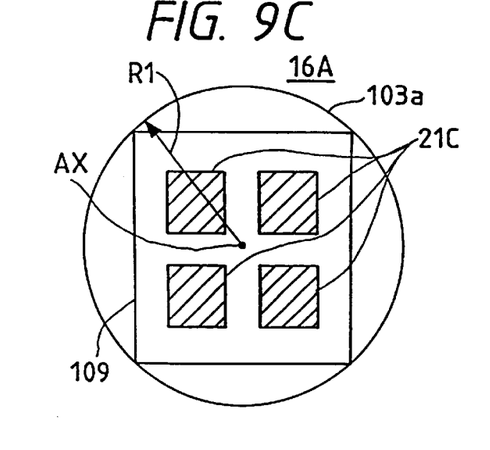
Figure 9D:
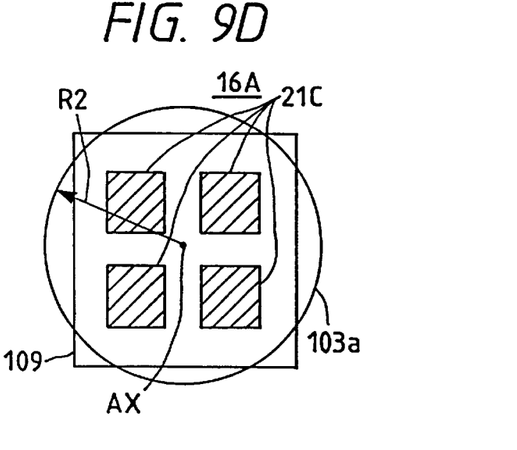
Figure 9E:
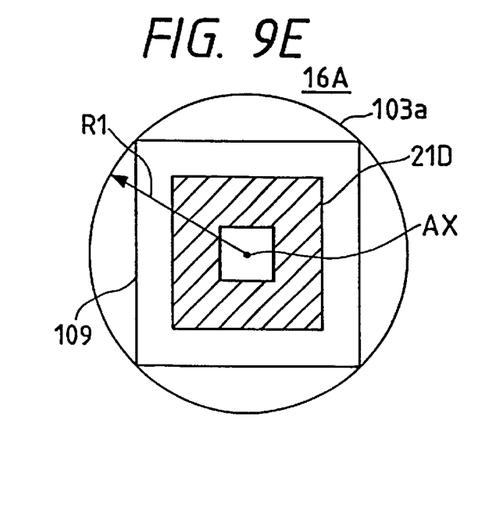
Figure 9F:
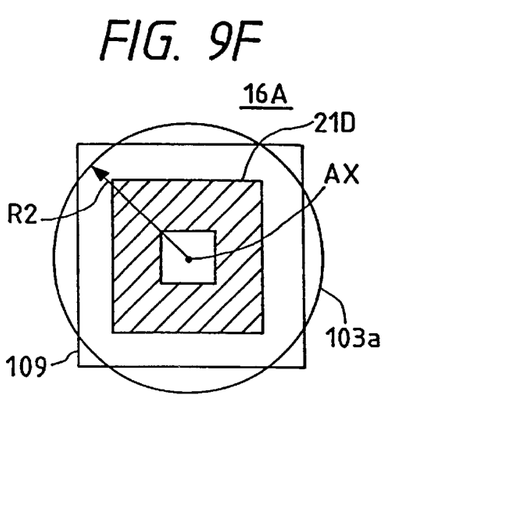

FIGS. 9A–9F are views, each showing the pupil plane of the projection optical system 15, of assistance in explaining a relationship between the aperture stop 16A and an image configuration (or a shape of the image) of the aperture stop of the illumination optical system in those modified embodiments. FIGS. 9A, 9C and 9E among those Figures illustrate a state where the length of the diagonal line of the internal edges 109 taking the substantially square shape defined by the movable blades 101A, 101B of the aperture stop 16A is substantially equalized to the diameter of the internal edge 103a of the iris stop 103. In this case, the radius R1 of the internal edge 103a of the iris stop 103 is a ½ length of the diagonal line of the square shape defined by the movable blades 101A, 101B. Further, FIGS. 9B, 9D and 9F illustrate a state where the diameter of the internal edge 103a of the iris stop 103 is set shorter than the length of the diagonal line of the internal edges 109 assuming the substantially square shape defined by the movable blades 101A, 101B of the aperture stop 16A. In this case, the radius R2 of the internal edge of the iris stop 103 is set shorter than the ½ length of the diagonal line of the square defined by the movable blades 101A, 101B.

FIGS. 9A and 9B illustrate a first modified embodiment. Referring to FIGS. 9A and 9B, the square aperture stop 8c of FIG. 2 is employed as the aperture stop of the illumination optical system, and an image thereof is formed as a light source image 21B. When effecting the optimization including the illumination optical system, the aperture stop of the illumination optical system is not necessarily circular, or rather, the image configuration of the aperture of the illumination optical system is equal to the aperture configuration of the aperture stop 16A in all positions. Then, it is desirable in terms of an easy-to-optimize numerical aperture that the aperture configuration of the illumination optical system be the square aperture stop 8c as in this embodiment. Herein, the image forming performance obtained depending on the aperture configuration of the aperture stop 16A shown in FIGS. 9A and 9B is equal with respect to the X- and Y-directional patterns of the reticle. For this reason, any in-between aperture configurations of those shown in FIGS. 9A and 9B are selectable as the aperture configuration of the aperture stop 16A.

FIGS. 9C and 9D illustrate a second modified embodiment, wherein the aperture stop 8a of FIG. 2, i.e. an aperture stop formed with four square apertures as disclosed in Japanese Patent Application Laid-Open No. 4-180612 (counterpart U.S. Application of which is Ser. No. 07/791, 138) is used as the aperture stop of the illumination system. As depicted in FIGS. 9C and 9D, an image of the aperture stop 8a is formed as a light source image 21C drawn by the oblique lines, and it is desirable that the aperture of the aperture stop 16A be not circular but square corresponding to this light source image 21C. The configuration may be arbitrary in the diagonal direction because of no occurrence of diffracted light from the reticle pattern 20 on the reticle 14 of FIG. 3, so the configuration may be square as the whole. There may be also taken such a configuration that four corners thereof cut off. That is, with respect to the lengthwise/crosswise patterns on the reticle 14, there is no change in the image forming characteristic to be obtained if the radius of the internal edge 103a of the iris stop 103 falls within a range of R1–R2.

FIGS. 9E and 9F illustrate a third modified embodiment, wherein there is used the rectangular frame-like aperture stop 8d of the illumination optical system of FIG. 2. That is, as shown by the oblique lines, a light source image is formed with a comparatively small square light shielding portion at its center on the pupil plane of the projection optical system. As in the first modified embodiment, the image forming performance obtained depending on the aperture configuration of the aperture stop 16A illustrated in FIGS. 9E and 9F is equal with respect to the lengthwise/crosswise patterns on the reticle 14. Therefore, any in-between aperture configurations of those shown in FIGS. 9E and 9F are selectable as the aperture configuration of the aperture stop 16A.

Figure 11:
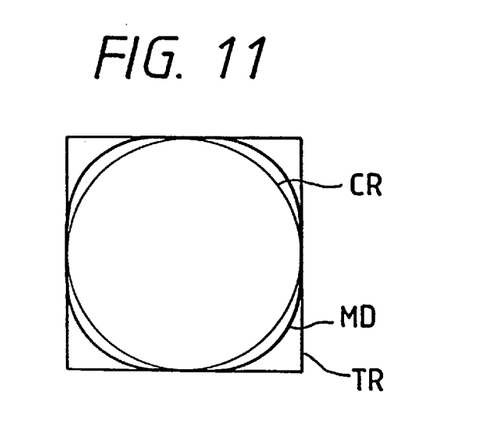
FIG. 11 is a view illustrating another modified embodiment of the aperture stop of the illumination optical system of FIG. 1.

Note that an external shape of the aperture stop of the illumination optical system is not limited to the circular and square shapes, but an optimum configuration may be selected within the range of the maximum aperture obtained. For example, even when using the aperture stop assuming such a configuration as to be shown by an in-between curve MD of a circular shape CR and a square shape TR as illustrated in FIG. 11, it is possible to obtain substantially the same image forming performance as that when using the aperture stop assuming the square shape TR.

In the embodiments discussed above, an exposure test was carried out by use of the projection exposure apparatus in which the aperture stop 16 of FIG. 5 was disposed on the pupil plane H of the projection optical system 15. The i-line emitted from the mercury lamp was used as the illumination light, and there was used the projection optical system including the circular aperture stop 22 the numerical aperture of which on the side of the wafer 17 is 0.57. Then, the maximum sine value of the angle of incidence of the diffracted light from the lengthwise/crosswise patterns was adapted to be controlled from 0.40 down to 0.57 by the movable blades 101A, 101B on the side of the wafer 17. The illumination optical system involved the use of a circular aperture stop the numerical aperture of which was 0.04 at the maximum as estimated on the side of the wafer 17.

Test Example 1

A test was conducted for transferring a 0.4 μm width line-and-space pattern by use of the conventional projection exposure apparatus in the embodiment described above.

The numerical aperture of the circular aperture stop 22 of the projection optical system remained at 0.57, but the sine of the lengthwise- and crosswise-direction diffraction angle was controlled down to 0.50 by the movable blades 101A, 101B. Further, the illumination optical system had a circular aperture the numerical aperture of which was set to 0.40. Disposed in this illumination optical system was such a square aperture stop that the sine of the lengthwise- and crosswise-direction incident angle was 0.30. With this arrangement, there was obtained a larger depth of focus than in the case where the blades 101A, 101B of the projection optical system and the square aperture stop of the illumination optical system are not disposed.

Test Example 2

Performed next was a test for transferring a 0.35 μm width line-and-space pattern by use of the projection exposure apparatus in the embodiment described above.

The numerical aperture of the circular aperture stop 22 of the projection optical system remained at 0.57, and the sine of the lengthwise- and crosswise-direction diffraction angle was controlled down to 0.50 by the movable blades 101A, 101B. Further, such a square aperture stop that the sine of the lengthwise- and crosswise-direction incident angle was 0.28 was disposed in the illumination optical system having the circular aperture with a numerical aperture of 0.40. With this arrangement, there was obtained a larger depth of focus than in the case where the blades 101A, 101B of the projection optical system and the square aperture stop of the illumination optical system are not disposed.

Note that if moving mechanisms 105a, 105b for the movable blades 101A, 101B are provided on a mechanism of rotation about the optical axis AX of the projection optical system 15, and, with respect to hyperfine patterns (oblique patterns) arrayed in the oblique direction, the incident angle of the diffracted light can be thereby controlled by rotating the movable blades 101A, 101B in a periodic direction of these patterns. With this control, the numerical aperture in the oblique direction can be reduced below those in the vertical/lateral directions, and the depth of focus can be also increased with respect to the oblique patterns.

Next, modified embodiments of the aperture stop 16 shown in FIG. 1 will be explained with reference to FIGS. 10A to 10C.

Figure 10A:
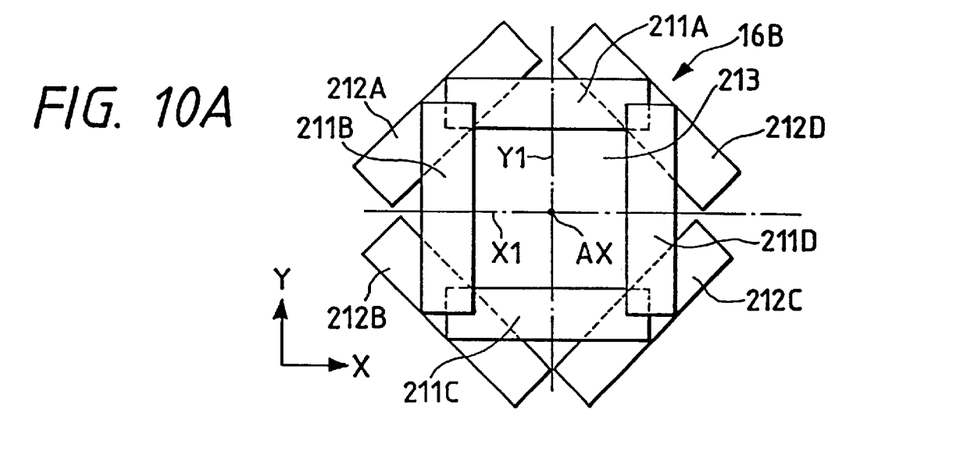
FIGS. 10A to 10C are plan views showing a modified embodiment of the aperture stop 16 of FIG. 1.
Figure 10B:
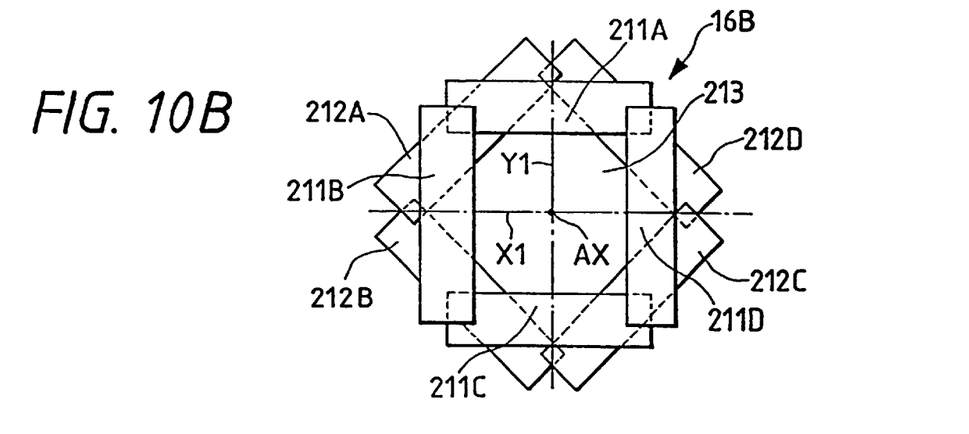
Figure 10C:
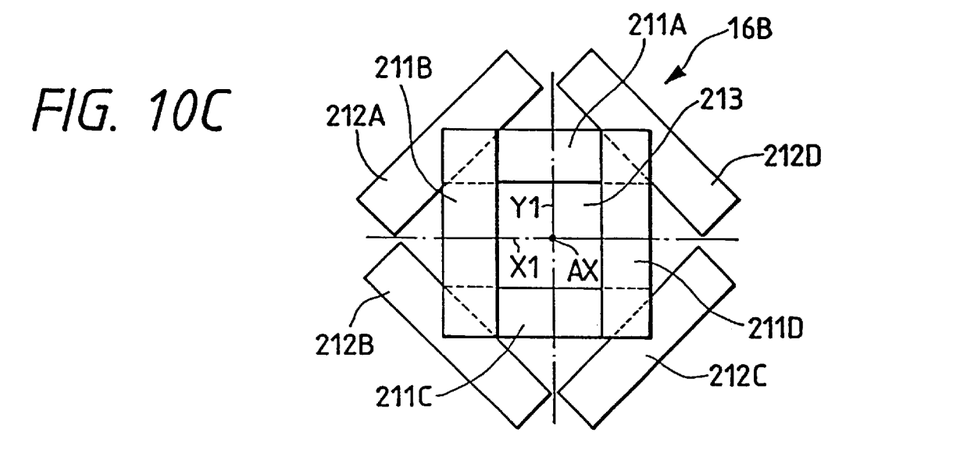

FIGS. 10A–10C are plan views of the movable blades constituting an aperture stop 16B in these modified embodiments. FIG. 10A shows a state where the aperture is maximized. FIG. 10C illustrates a state where the aperture is minimized. FIG. 10B shows a state of an in-between aperture thereof. Referring to FIG. 10A, the aperture stop 16B is constructed of a combination of a set of four movable tabular blades 211A–211D each assuming the same rectangular shape (hereinafter called a movable blade unit 211) and another set of four movable tabular blades 212A–212D each taking the same rectangular shape (hereinafter called a movable blade unit 212). The movable blade unit 211 is so disposed as to be contiguous to the surface of the movable blade unit 212 or in close proximity thereto but in parallel to each other.

The edges, bearing the face-to-face relationship with each other, of the movable blade unit 211 are disposed in positions symmetric with respect to the optical axis AX. The edges, adjacent to each other, of the movable blade unit 211 are so disposed as to be substantially orthogonal to each other in the X- and Y-directions but disposed in such a form that the two edges thereof slide on each other in the Z-direction. Further, the internal edges, bearing the face-to-face relationship with each other on the basis of the optical axis AX, of the movable blades 211A–211D of the movable blade unit 211 are formed as rectilinear edges parallel to the X- and Y-axes, respectively. The movable blade unit 212 has also the same construction. However, it does not happen that the two edges of the blades adjacent to each other are always overlapped with each other as seen in the movable blade unit 211, and there appears such a state that the blades adjacent to each other are overlapped when the aperture defined by the movable blade unit 212 is narrowed. Also, the movable blade unit 211 and the movable blade unit 212 are disposed at an angle of 45 degrees to each other. The movable blade units 211, 212 are moved together by unillustrated moving systems in parallel to a line toward the optical axis AX, whereby a configuration of an aperture 213 formed around the optical axis AX is varied by the movable blade units 211, 212.

As discussed above, FIG. 10A illustrates the state where the aperture 213 is maximized. Referring to FIG. 10A, the respective movable blades of the movable blade units 211, 212 are disposed in positions farthest away from the optical axis AX, and the aperture 213 defined by those movable blades becomes a square aperture defined also by the movable blades unit 211. When the movable blade unit 212 is moved toward the optical axis AX while the movable blade unit 211 of FIG. 10A is set in the same state, as illustrated in FIG. 10B, the four angular portions of the square aperture 213 of FIG. 10A become such an aperture as to be cut by oblique lines having an angle of approximately 45 degrees to the X- and Y-axes. Further, FIG. 10C illustrates the state where the aperture 213 is minimized. In FIG. 10C, each of the movable blades of the movable blade unit 211 is disposed in a position closest to the optical axis AX, and the aperture 213 defined by those movable blades becomes a square aperture. It is to be noted that there can be formed a variety of in-between square apertures, having sizes different from those shown in FIGS. 10A and 10C. Further, it is also possible to form such an aperture that the angular portions of the square are shielded.

The aperture stop 16B in this embodiment s constructed of a combination of the movable blade unit 211, i.e., a set of four movable blades 211A–211D and the movable blade unit 212, i.e., a set of four movable blades 212A–212D. There are formed a variety of square apertures having different sizes or an the aperture in which the corner portions are shielded, thereby making it possible to correspond to not only lengthwise- and crosswise-patterns on the reticle 14 but also the oblique patterns.

Note that, e.g., the projection optical system is not confined to a lens system but may be a reflecting system including a mirror or reflecting-refraction (catadioptric) system in the embodiments discussed above.

Furthermore, the present invention is applicable to not only the stepper type projection exposure apparatus but also a projection exposure apparatus of a step-and-scan system for scanning while the reticle and the wafer are synchronized with each other.

Thus, the present invention is not confined to the embodiments discussed above but may take a variety of constructions without deviating from the spirit and scope of the present invention.

According to the projection optical system of the present invention, a part of the outline of the stop assumes a rectilinear shape, and this stop is provided on a Fourier transform plane with respect to a first surface of the projection optical system or on a plane in the vicinity thereof. It is therefore possible to uniformly restrict the angle-of-passage range of a diffracted light in the predetermined direction. Accordingly, the maximum value of the exit angle of the light emerging from the projection optical system can be substantially uniformized without depending on the incident angle of a illumination light in the direction perpendicular to the predetermined direction thereof, and a decline in the depth of focus due to an excessive numerical aperture can be prevented. Further, the angular range of the passage of the diffracted light is fixed in the predetermined direction, and hence there is an advantage in which a projection optical system including the angle-of-incidence range of the illumination light is easy to optimize.

Further, if the outline of the aperture of the stop includes rectilinear portions parallel to a symmetric axis passing through the optical axis of the projection optical system and orthogonal to the predetermined direction, the effective exit angle of the diffracted light is substantially completely uniformized without depending on the incident angle of the illumination light in the direction perpendicular to the predetermined direction thereof, and the image forming performance of the periodic pattern in the predetermined direction is enhanced.

Further, when the stop has a plurality of movable blades including rectilinear edges each for defining the outline of the aperture, the aperture of the stop becomes a variable aperture having the rectilinear edges. For instance, the shape of the aperture can be varied corresponding to a type of the pattern for projection or, e.g., a real exposure time or an adjusting time of the projection optical system.

In addition, according to a projection exposure apparatus equipped with the projection optical system, the range of the effective diffraction angle changes depending on the incident angle of the illumination light incident on the projection optical system, and it is feasible to reduce a phenomenon in which the numerical aperture of the projection optical system is not effectively used, with the result that an image can be formed based on the optimum numerical aperture with respect to all the illumination light beams. Further, the illumination optical system performs Köhler illumination, and the surface light source has a rectilinear portion. Therefore, harmful image forming beams are reduced, thereby enhancing the image forming characteristics.

Also, if the surface light source of the illumination optical system has a rectangular frame-like shape, image forming characteristics are enhanced for patterns in a predetermined direction of the patterns on the mask and in a direction orthogonal thereto.

What is claimed is:

1. A projection optical system for projecting and forming an image of a pattern arrayed on a first surface, and exhibiting a periodicity in a predetermined direction, on a second surface, said projection optical system comprising a stop having an aperture showing a line symmetry with respect to a symmetric axis passing through an optical axis of said projection optical system and extending in a direction orthogonal to said predetermined direction and having an outline at least a part of which is rectilinear, said stop being provided on a Fourier transform plane of the first surface within said projection optical system or a plane in the vicinity thereof, said stop limiting, with said aperture having said rectilinear part, an area through which diffracted light generated with said pattern passes.

2. The projection optical system according to claim 1, wherein the outline of said aperture of the stop has a rectilinear portion parallel to the symmetric axis.

3. The projection optical system according to claim 1, wherein said stop has a plurality of movable blades with rectilinear edges each for defining the outline of the aperture.

4. The projection optical system according to claim 3, wherein said movable blades have a first blade set consisting of four blades moved interlocking with each other to define a substantially rectangular aperture with a variable size and a second blade set consisting of four blades moved interlocking with each other to define the substantially rectangular aperture with the variable size and making an angle of 45 degrees to each of said blades of said first blade set.

5. The projection optical system according to claim 1, wherein said stop has a fixed stop formed with a circular aperture and a variable stop formed with a rectangular aperture with a variable size.

6. A projection exposure apparatus comprising:

a projection optical system for projecting and forming an image of a pattern arrayed on a first surface, and exhibiting a periodicity in a predetermined direction, onto a second surface;

a stop having an aperture provided on a Fourier transform plane of the first surface within said projection optical system or a plane in the vicinity thereof and showing a line symmetry with respect to a symmetric axis passing through an optical axis of said projection optical system and extending in a direction orthogonal to said predetermined direction and having an outline at least a part of which is rectilinear, said stop limiting, with said aperture having said rectilinear part, an area through which diffracted light generated with said pattern passes; and an illumination optical system for Köhler-illuminating said first surface with beams of exposure illumination light that are emitted from a surface light source having an outline corresponding to a rectilinear portion of the outline of the aperture of said stop that has a rectilinear shape, wherein a mask formed with a pattern to be transferred is set on the first surface, a photosensitive substrate is set on the second surface, and the pattern on said mask is exposed onto said photosensitive substrate through said projection optical system with the light beams from said illumination optical system.

7. The projection exposure apparatus according to claim 6, wherein said surface light source of said illumination optical system is of a rectangular frame-like configuration.

8. The projection exposure apparatus according to claim 6, wherein the outline of said stop has a rectilinear portion parallel to the symmetric axis.

9. The projection exposure apparatus according to claim 6, wherein said stop has a plurality of movable blades with rectilinear edges each for defining the outline of the aperture.

10. The projection exposure apparatus according to claim 9, wherein said movable blades have a first blade set consisting of four blades moved interlocking with each other to define a substantially rectangular aperture with a variable size and a second blade set consisting of four blades moved interlocking with each other to define the substantially rectangular aperture with the variable size and making an angle of 45 degrees to each of said blades of said first blade set.

11. The projection exposure apparatus according to claim 6, wherein said stop has a fixed stop formed with a circular aperture and a variable stop formed with a rectangular aperture with a variable size.

12. A projection optical system for projecting an image of a pattern arrayed on a first surface, and exhibiting a periodicity in a predetermined direction, onto a second surface, said projection optical system comprising:

an aperture stop disposed on or in the vicinity of a pupil plane of said projection optical system and having an edge extending in a direction orthogonal to the predetermined direction so as to shield a part of diffracted light generated with said pattern.

13. A projection exposure apparatus for transferring a pattern formed on a mask, and periodically arrayed in a predetermined direction, onto a photosensitive substrate through a projection optical system, said projection exposure apparatus comprising:

an aperture stop disposed within or in the vicinity of a pupil plane of said projection optical system and having an edge extending in a direction orthogonal to the predetermined direction so as to shield a part of diffracted light generated with said pattern.

14. The projection exposure apparatus according to claim 13, wherein at least one of a configuration and a size of said aperture stop is variable.

15. A projection exposure apparatus according to claim 13, further comprising:

an illumination optical system that illuminates said mask; and a stop disposed within or in the vicinity of a pupil plane of said illumination optical system, that rectilinearly defines a portion of an outline of a light source image formed thereat.

16. A projection exposure apparatus according to claim 15, wherein said stop disposed within or in the vicinity of a pupil plane of said illumination optical system defines said image of the light source in a rectangular frame-like shape.

17. A projection exposure apparatus according to claim 15, wherein a shape of said aperture stop disposed within or in the vicinity of the pupil plane of said projection optical system corresponds to a shape of said stop disposed within or in the vicinity of the pupil plane of said illumination optical system.

18. An exposure apparatus according to claim 13, wherein at least one of the shape or size of the aperture of said aperture stop is varied in accordance with an exposure condition.

19. An exposure apparatus according to claim 13, wherein the size of the aperture of said aperture stop is varied in accordance with the pattern formed on said mask.

20. A projection exposure apparatus for forming a pattern formed on a mask on a photosensitive substrate through a projection optical system, comprising:

an illumination optical system that illuminates said mask;

a first aperture stop, disposed within a pupil plane of said illumination optical system, that defines rectilinearly at least a part of an outline of a light source image formed on the pupil plane;

a blind, disposed in a plane conjugate with a pattern surface of said mask in said illumination optical system, that limits an illumination area with which said mask is illuminated; and a second aperture stop, disposed within a pupil plane of said projection optical system, that defines a rectilinear edge corresponding to a rectilinear edge of said first aperture stop so as to shield a part of diffracted light generated with said pattern.

21. A projection exposure apparatus for forming a pattern formed on a mask on a photosensitive substrate through a projection optical system, comprising:

an illumination optical system that illuminates said mask; and an aperture stop, disposed within or in the vicinity of a pupil plane of said projection optical system, and having a rectilinear edge corresponding to an outline of a light source image formed on a pupil plane of said illumination optical system so as to shield a part of diffracted light generated with said pattern.

22. A projection exposure apparatus according to claim 21, wherein said pattern comprises a pattern periodically arrayed in a predetermined direction, and said rectilinear edge extends in a direction orthogonal to said predetermined direction.

23. A projection exposure apparatus according to claim 21, further comprising:

a blind, disposed in a plane conjugate with a pattern surface of said mask in said illumination optical system, that limits an illumination area with which said mask is illuminated.

24. A method for making a projection exposure apparatus comprising:

providing a projection optical system that transfers a pattern formed on a mask, said pattern exhibiting a periodicity in a predetermined direction, onto a substrate; and providing a first aperture stop disposed within or in the vicinity of a pupil plane of said projection optical system, and having an edge extending in a direction orthogonal to said predetermined direction.

25. A method according to claim 24, further comprising:

providing an illumination optical system that illuminates said mask; and a second aperture stop disposed within or in the vicinity of a pupil plane of said illumination optical system, that rectilinearly defines at least a portion of an outline of a light source image formed thereat.

26. A projection exposure method in which a pattern formed on a first surface, and exhibiting a periodicity in a predetermined direction, is transferred onto a second surface through a projection optical system, wherein:

an image of said pattern is transferred onto said second surface through an aperture stop while shielding, with said aperture stop, a part of diffracted light generated with said pattern, said aperture stop being disposed on or in the vicinity of a pupil plane of said projection optical system and having an edge extending in a direction orthogonal to said predetermined direction.

27. A projection exposure method according to claim 26, wherein said first surface is illuminated with an illumination optical system, wherein said edge extending in a direction orthogonal to said predetermined direction corresponds to an outline of a light source image formed on a pupil plane of said illumination optical system.

28. An exposure method according to claim 26, wherein the size of the aperture of said aperture stop is varied in accordance with an exposure condition.

29. A projection exposure method in which a pattern formed on a first surface, and exhibiting a periodicity in a predetermined direction, is transferred onto a second surface through a projection optical system, wherein:

an image of said pattern is transferred onto said second surface through a stop while shielding, with said stop, a part of diffracted light generated with said pattern, said stop being provided on a Fourier transform plane of the first surface or on a plane in the vicinity thereof within said projection optical system, and having an aperture showing a line symmetry with respect to an axis passing through an optical axis of said projection optical system, extending in a direction orthogonal to said predetermined direction, and having an outline at least a part of which is rectilinear.

30. An exposure method according to claim 29, wherein a size of the aperture of said stop is adjusted before the image of the pattern is transferred onto said second surface.

* * * * *